United States Patent
Vaughan, II et al.

(10) Patent No.: US 7,583,100 B2
(45) Date of Patent: Sep. 1, 2009

(54) TEST HEAD FOR TESTING ELECTRICAL COMPONENTS

(75) Inventors: Fillmore L. Vaughan, II, Ardmore, OK (US); Daniel G. Metzer, Ardmore, OK (US)

(73) Assignee: STS Instruments, Inc., Ardmore, OK (US)

( * ) Notice: Subject to any disclaimer, the term of this patent is extended or adjusted under 35 U.S.C. 154(b) by 390 days.

(21) Appl. No.: 11/606,103

(22) Filed: Nov. 30, 2006

(65) Prior Publication Data
US 2008/0129323 A1    Jun. 5, 2008

(51) Int. Cl.
*G01R 1/073*  (2006.01)
*G01R 31/02*  (2006.01)

(52) U.S. Cl. ............... 324/762; 324/158.1; 324/754

(58) Field of Classification Search ......... 324/754–765, 324/158.1, 72.5; 439/132
See application file for complete search history.

(56) References Cited

U.S. PATENT DOCUMENTS

| | | | |
|---|---|---|---|
| 2,825,871 A | 3/1958 | Evans | |
| 2,954,521 A * | 9/1960 | McKee | 324/72.5 |
| 3,345,567 A | 10/1967 | Turner et al. | |
| 3,447,078 A | 5/1969 | Levy | |
| 4,651,086 A | 3/1987 | Domenichini et al. | |
| 4,893,086 A | 1/1990 | Shrewsbury | |
| 5,307,019 A | 4/1994 | Robey et al. | |
| 5,550,477 A | 8/1996 | Domenichini et al. | |
| 5,675,247 A | 10/1997 | Miller et al. | |
| 6,856,156 B2 | 2/2005 | Liang et al. | |
| 2004/0113638 A1 | 6/2004 | Corbin, Jr. et al. | |
| 2004/0227534 A1 | 11/2004 | Mueller | |
| 2005/0007132 A1 | 1/2005 | Richmond, II et al. | |
| 2005/0151551 A1 | 7/2005 | Okuda et al. | |

FOREIGN PATENT DOCUMENTS

EP    0 822 417 A2    4/1998

* cited by examiner

*Primary Examiner*—Ernest F Karlsen
(74) *Attorney, Agent, or Firm*—Bacon & Thomas, PLLC

(57) ABSTRACT

A test head for testing electronic parts including a base having radial slots for receiving contact mounting assemblies. The contact mounting assemblies are removably mounted to the base and are radially adjustable in order to test parts having different diameters and bar counts. The contact mounting assemblies each include a piston cylinder and each removably receive a contact probe assembly carrying a plurality of spring loaded contact probes that are easily replaceable.

19 Claims, 4 Drawing Sheets

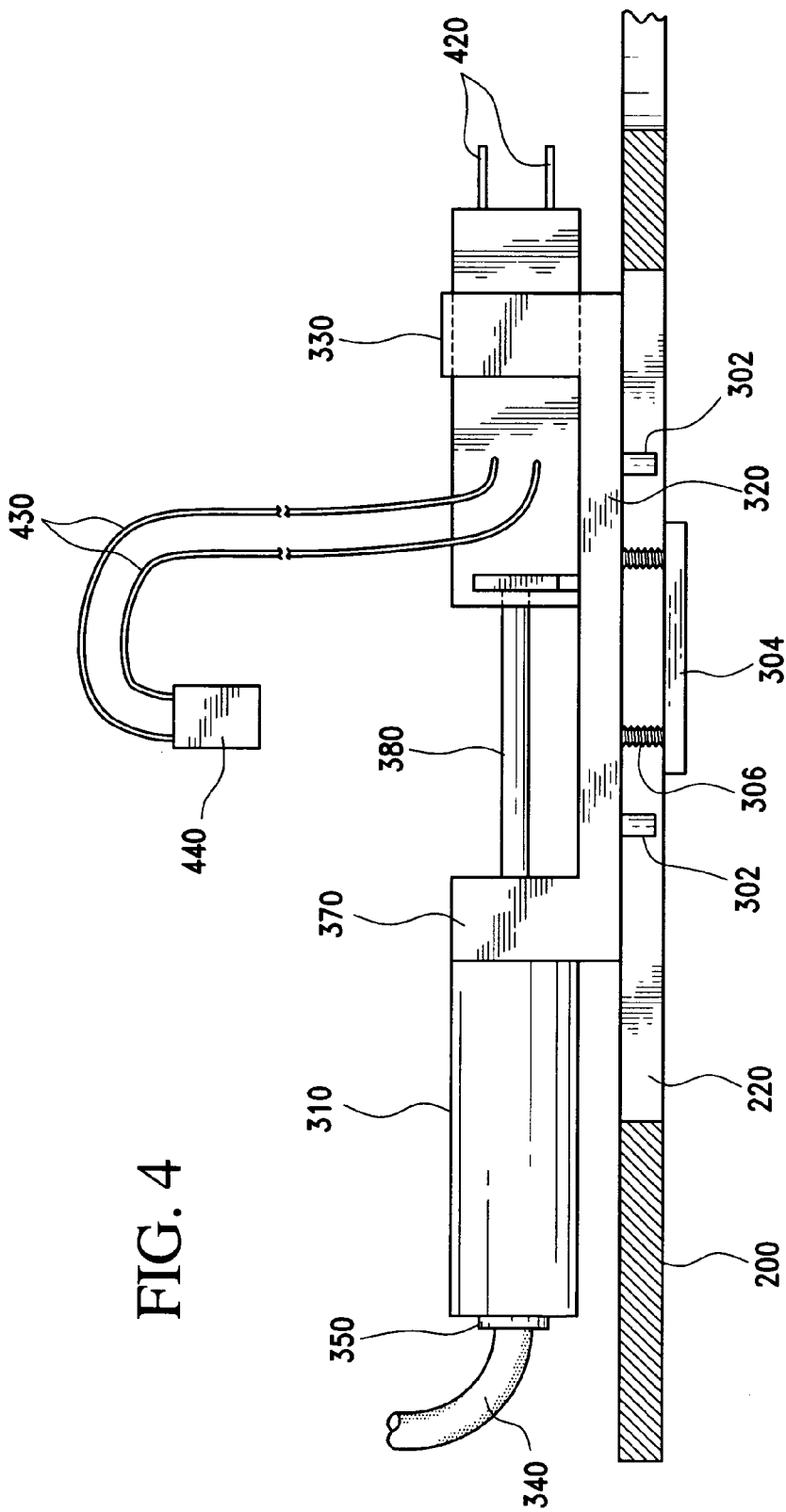

TEST HEAD FOR TESTING ELECTRICAL COMPONENTS

FIELD OF THE INVENTION

The present invention relates generally to the field of electronic component testing and more particularly to the field of test heads for testing electrical components.

BACKGROUND

Test heads are used in conjunction with a test system to determine proper functionality of electrical components and parts. The test head is the link between the test system and the device under test and ensures a proper connection to the device under test.

An exemplary use of a test head is the testing of bars and coils in an armature of an electrical motor. Typically, test heads are only useable with components having a single defined size. Thus, multiple test heads are required to test different components having different sized diameters. Also, test heads are typically designed to test components having a single defined bar count. Likewise, different test heads are required to test components that have different bar counts.

Conventional test heads are expensive and time consuming to manufacture since the manufacturing of conventional test heads requires skilled machinists and the use of expensive machine shop equipment. These expenses are compounded by the fact that many different sized test heads are required to test different sized components and components having different bar counts.

The test head of this disclosure solves many of the aforementioned problems through the relative ease of its manufacture and its inherent adjustability, as will be more fully explained in the following discussion.

SUMMARY

In order to overcome the shortcomings of conventional test heads, different embodiments are provided which pertain to an inventive test head that can be used to test different components having different sized diameters and to test different components having different bar counts.

In a first embodiment, the test head includes a base portion and a plurality of contact probe assemblies removably mounted to a plurality of contact mounting assemblies. The contact mounting assemblies are removably mounted to the base in a manner that allows the contact mounting assemblies to be radially adjusted with respect to the base.

In another embodiment, the test head may have piston cylinders mounted on each of the plurality of contact mounting assemblies. When the piston cylinder is actuated, the contact probe assemblies are driven in a radial direction towards the center of the test head in order to contact the component to be tested, for example commutator bars on an armature.

In a further embodiment, each of the contact probe assemblies may comprise a spring probe receptacle for receiving a plurality of biased spring probes. The spring probe receptacles may be configured to engage a piston head of the piston cylinders, for example by having a recessed receiving portion or a snap-fit portion.

In yet another embodiment, the contact mounting assemblies of the test head may each have a receiving portion for receiving one of the contact probe assemblies. The receiving portion can include a snap-fitting, such that the contact probe assemblies are snap-fit into the receiving portions of the contact mounting assemblies.

In still yet another embodiment, the test head can comprise a plurality of radial slots in the base portion. Each contact mounting assembly may include a plurality of mounting pins that are received within one of the slots, such that the mounting pins can move or slide radially within the slots. Thus, the contact mounting assemblies are radially adjustable with respect to the base portion.

In yet another embodiment, the contact mounting assemblies can each have at least one mount that can be used to secure the contact mounting assembly to the base in a specific radial position. Preset markings on the base can be used to aid in the proper placement of the contact mounting assemblies. For example, lining up the mount with a marking can indicate the proper position of the contact mounting assemblies.

In yet still another embodiment, the number of contact probe and contact mounting assemblies can be varied, such that electrical components that have different bar counts can be tested using the same test head.

One of the numerous advantages of the disclosed embodiments is the ability to test electrical components having different diameters using the same test head. Additionally, the same test head can be used to test components that have different bar counts, by altering the number of contact probe and mounting probe assemblies, or by altering the number of contact probe assemblies or further by altering the number of piston cylinders that are actuated.

These, and other advantages of the improved test head, will become readily apparent and better understood in view of the following description, appended claims, and accompanying drawings.

BRIEF DESCRIPTION OF THE DRAWINGS

FIG. 4 is a side elevation view of a contact probe assembly mounted to a contact mounting assembly, the contact mounting assembly mounted to a base, and the base shown in cross section.

Figure 1:
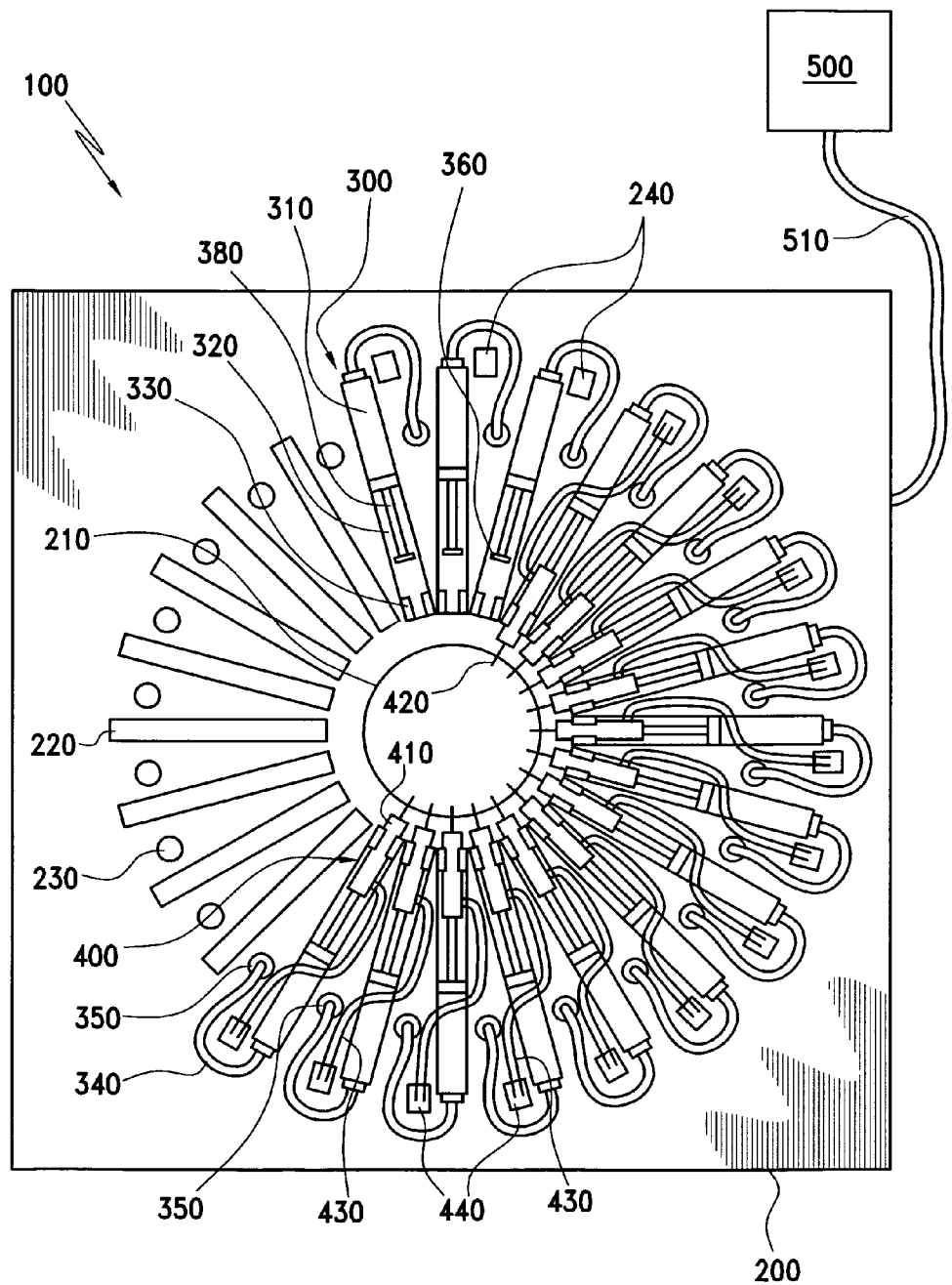
FIG. 1 is a top plan view of an embodiment of a test head in partial assembly to better illustrate the features thereof.

It should be noted that the drawing figures are not necessarily drawn to scale, but instead are drawn to provide a better understanding of the components thereof.

DETAILED DESCRIPTION OF VARIOUS EMBODIMENTS

A. Environment and Context of the Various Embodiments

The following description of an improved test head describes a test head as used in the context of testing armatures for electrical motors. However, the test head disclosed herein is not limited to the function of testing electrical motor armatures, but instead may be used to test any number of different electrical components.

An electric motor will have an armature that includes a commutator. The commutator will have a fixed diameter and will have a fixed number of bars, which are connected to the coils. Typically, a test head will be designed to test armatures having a specific number of commutator bars and a specific commutator diameter.

The following discussion details a test head that is relatively easy and inexpensive to manufacture, and that can be used with commutators or components having different diameters and different bar counts. Thus, the test head provides users with great flexibility in terms of testing different sized components, and wholly different components, using a single test head.

B. Detailed Description of a First Embodiment

A first embodiment of a test head is illustrated in FIGS. 1-5. In accordance with this embodiment, the test head 100 includes an inexpensive and relatively easy to manufacture base or substrate 200. The base 200 is contemplated as a printed circuit board (PCB) with built-in wiring, but any other non-conductive material or mechanism that can be wired or that can hold conductors, such as a film or other medium, may be used. One advantage of using a printed circuit board is that they are relatively easy and inexpensive to manufacture and do not require a skilled machinist or the equipment of a machine shop to produce. Thus, the test head in accordance with this embodiment may be made relatively quickly and inexpensively.

The base 200 has a clearance hole 210 at its center, so that an armature (not shown) may pass through the base 200 such that the commutator bars are appropriately aligned for testing. Of course, other components may also be tested in a similar fashion. The base 200 also includes a plurality of radially oriented slots 220 and a plurality of holes 230, each positioned near an end of a slot 220, although the holes 230 may be located in alternate positions.

Figure 5:
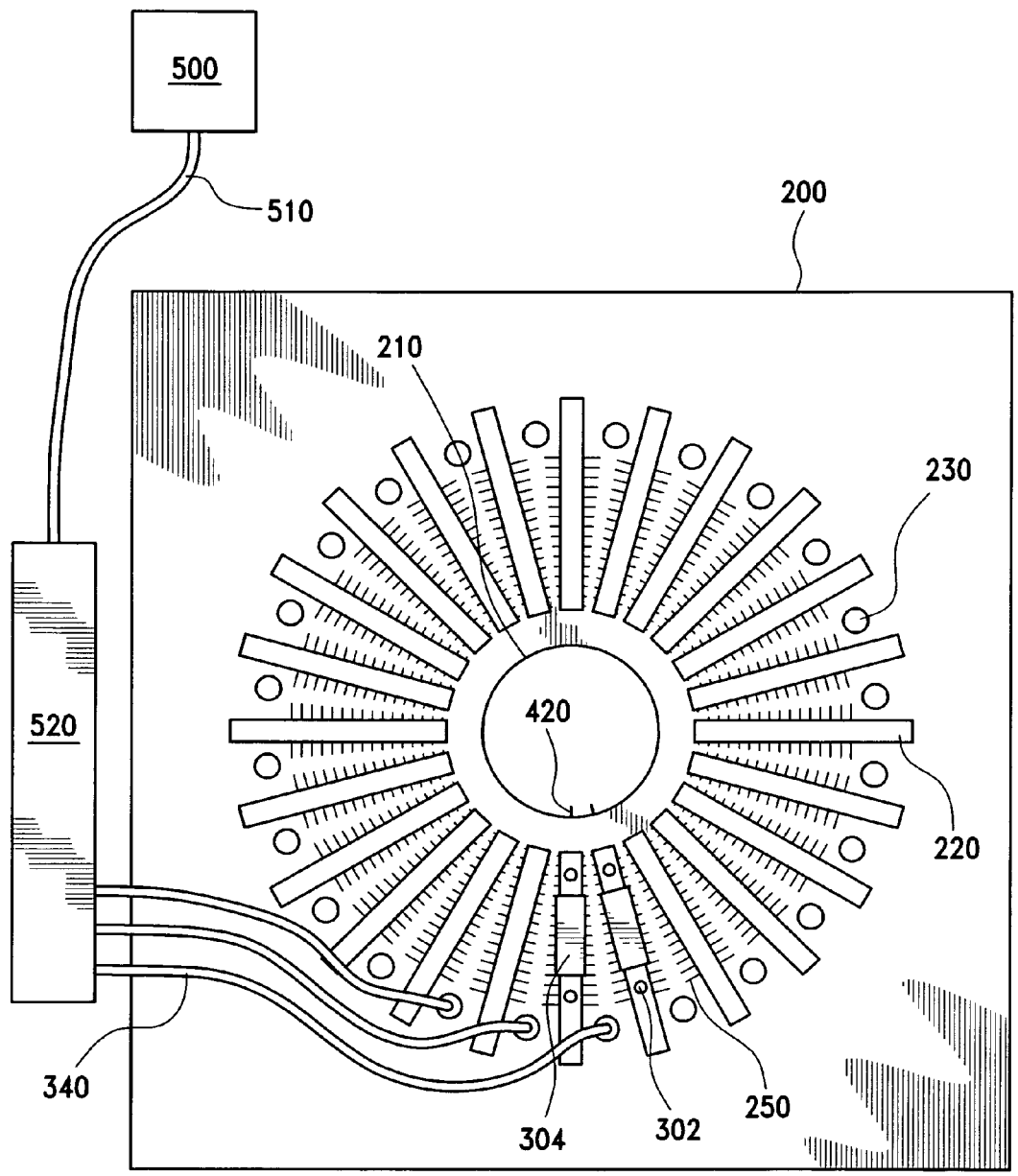
FIG. 5 is a bottom plan view of a test head in partial assembly to better illustrate the features thereof.

As can be seen in FIG. 5, the base 200 can also include markings 250 on the reverse side to aid in aligning the components of the test head 100, as discussed in more detail below. While the markings 250 are only shown on one side of the base 200, it is understood that the markings could be located on both sides of the base 200 to aid in the placement of the test head 100 components.

Figures 2, 3:
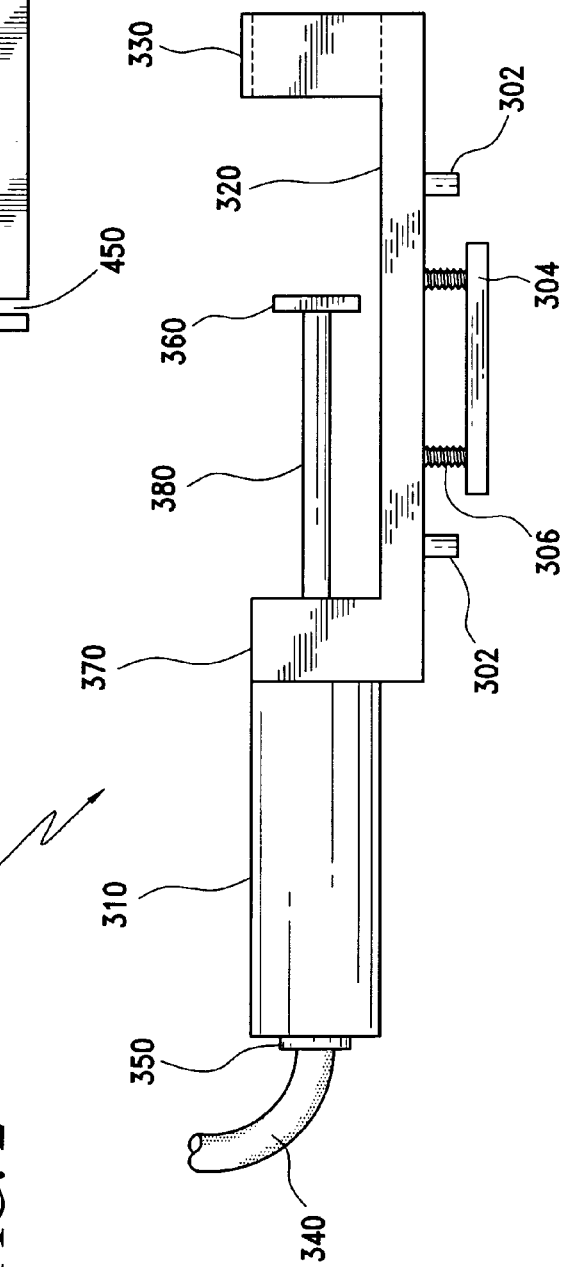
FIG. 2 is a side elevation view of a contact mounting assembly, including the piston cylinder.
FIG. 3 is a side elevation view of a contact probe assembly.

A contact mounting assembly 300, which can best be seen in FIG. 2, is provided for the test head 100. Each contact mounting assembly includes a piston cylinder 310 mounted thereon in any conventional manner as will be well known to those having ordinary skill in the art of test heads. For example, the contact mounting assembly 300 can have an extending portion 370 at a distal portion thereof. A clearance hole can be provided in the extending portion to allow a cylinder rod 380 to pass therethrough. The clearance hole may provide a friction fit for the front end of the piston cylinder 310, or the face of the piston cylinder 310 may be adhesively adhered to the face of the extending portion 370, in any known manner. Additionally, any suitable connection may be provided between the piston cylinder 310 and the contact mounting assembly 300.

Each piston cylinder 310 further includes a piston head 360 attached to the cylinder rod 380. The piston head 360 may be integral with the cylinder rod 380, or alternatively the piston head 360 may be a separately formed cap that is screwed onto a threaded tip of the cylinder rod 380. Of course, any suitable configuration may be used.

Hoses 340 for supplying an actuating pressure, either pneumatic or hydraulic, are connected to the distal portion of each piston cylinder 310. Exemplary pneumatic piston cylinders are available from Bimba Manufacturing Co., Monee, Ill., as part no. 0070.5. The hoses 340 may be connected to the piston cylinders 310 using a snap-fitting connection mechanism as would be known to a skilled artisan. The snap-fitting can include an L-shape for redirecting the hose 340 perpendicular to the piston cylinder 310. The hoses 340 are looped and may extend through the holes 230 in the base 200. Each hose 340 may include sealing washers 350 to ensure an air and fluid tight seal between the hose 340 and the piston cylinder 310 and to provide protection between the hose 340 and the holes 230 in the base 200. While a piston cylinder is disclosed, any suitable actuating mechanism known to those having skill in the art may be used. Further, while the hoses 340 are shown extending through the base 200, this is not a required configuration. Instead, the hoses 340 could be connected directly to a manifold or pressure source.

The piston cylinders 310 can be pneumatic, hydraulic or of a solenoid configuration. If a solenoid configuration is used, the hoses 340 would be replaced by wiring and the pressure source discussed below would be replaced by a source of electricity. In order to ensure the proper functioning of the test head 100, the piston cylinders 310 should include a failsafe, such as an internal spring, that returns the piston heads 360 to their un-actuated state, which is positioned radially away from the clearance hole 210 in the base 200 when the pneumatic or hydraulic pressure is removed from the piston cylinders 310.

The use of piston cylinders 310 having a fail-safe return is advantageous in that the contact probe assemblies 400, which are attached to the piston heads 360, as detailed below, are also radially spaced from the clearance hole 210 in the base 200, so that the spring loaded contact probes 420 are not accidentally damaged.

Returning to the contact mounting assembly 300, each one is provided with a plurality of mounting pins 302 that are disposed at the bottom of each contact mounting assembly 300 for assisting with aligning the contact mounting assemblies 300 within the slots 220 in the base 200. The mounting pins 302 may be integrally formed with the contact mounting assembly 300, or they may be separate elements that are formed to engage either the outer surface or an interior surface, such as a hole, of the contact mounting assemblies 300. For example, the mounting pins 302 may be adhered to the lower surface of the contact mounting assemblies 300 in a known manner. Alternatively, the contact mounting assemblies 300 may be provided with holes or recesses for receiving the contact mounting pins 302. The mounting pins 302 may be press fit, adhesively bonded, or screwed into the holes or recesses or otherwise connected in a known manner.

A mount 304 may also be provided for each contact mounting assembly 300. The mount 304 may be a metal or plastic blank that engages the base 200 in a frictional manner in order to fix the contact mounting assemblies 300 in place. This is accomplished by providing the contact mounting assemblies with at least one mounting screw 306 that extends through the contact mounting assembly to engage the mount 304 in a threaded manner. While one mounting screw 306 is sufficient to fix the contact mounting assemblies 300 in place on the base 200, two spaced mounting screws 306 aid in keeping all of the contacting mounting assemblies 300 oriented in the same plane.

In this embodiment, a receiving portion 320 having a snap-fitting section 330 can be provided for each contact mounting assembly 300. The snap-fitting portion 330 may have any suitable configuration, including flexible tines or snaps. Each contact mounting assembly 300 is thus configured to removably receive a contact probe assembly 400, which is shown in FIG. 3.

Each contact probe assembly 400 includes a spring probe receptacle 410 which receives a plurality of spring loaded contact probes 420. Exemplary spring probe receptacles are available from Everet Charles Technologies, 27 Maxwell Avenue, Bearsden, Glasgow G61 1PA, as part no. A6300 305-001 (SPR-3W). The spring loaded contact probes 420 are of a type known to the skilled artisan. Exemplary spring loaded contact probes are available from Everet Charles Technologies, 27 Maxwell Avenue, Bearsden, Glasgow G61 1PA, as part no. A6300 399-008 (SPA-3D-1).

The spring loaded contact probes 420 are easily removable and replaceable within the spring probe receptacle 410 such that replacing damaged spring loaded contact probes 420 is simplified and takes minimal time.

Each spring probe receptacle includes a test lead 430 for each spring loaded contact probe 420 received therein. The test leads 430 from each spring probe receptacle 410 are wired to a connector 440 in a known manner. Exemplary test leads are available from Wiremax, Ltd., Toledo, Ohio, as part no. WUS-1024-9. Exemplary connectors are available from Molex, Inc., Lisle, Ill., as part no. 39860-0102.

Each spring probe receptacle 410 also includes a receiving portion 450 that is configured to engage the piston head 360. The receiving portion 450 may be a recess, slot, groove, snap-fit, or any other configuration that allows the spring probe receptacle 410 to be easily engaged and disengaged with the piston head 360, while still providing a secure transfer of linear motion between the piston head 360 and the spring probe receptacle 410 with limited or no slop or backlash between the piston head 360 and the spring probe receptacle 410.

As best seen in FIG. 4, each contact probe assembly 400 is removably connected to a respective contact mounting assembly 300. The spring probe receptacles 410 are placed into the receiving portion 320 of the contact mounting assembly 300. The spring probe receptacles 410 are retained on the contact mounting assembly 300 via the snap-fitting section 330 of the receiving portion 320.

The snap-fitting section 330 can be constructed in any appropriate manner known to the skilled artisan. For example, receiving portions 320 can include vertically extending resilient tines that receive the spring probe receptacles 410. In addition, the spring probe receptacles 410 can have a reduced width portion that engages the resilient tines.

In this manner, the contact probe assemblies 400 are easily engaged with and removed from the contact mounting assemblies 300. This ease of removability provides an easy means of repair and replacement of damaged contact probe assemblies 400. Further, since each contact probe assembly 400 is essentially the same, they are interchangeable as well as easily replaced.

In alternative forms, the contact probe assemblies 400 can be mounted to the contact mounting assemblies 300 in any suitable manner known to those skilled in the art.

As also shown in FIG. 4, each contact mounting assembly 300 can be mounted to the base 200. The mounting pins 302 on the bottom of the contact mounting assemblies 300 are received within a slot 220 on the base 200. The mounting pins 302 are moveable or slidable within the slot 220, such that the contact mounting assemblies 300 can be radially adjusted with respect to the base 200.

This radial adjustability is an important feature that allows different sized armatures to be tested. In order to test a commutator having a larger diameter, each contact mounting assembly 300 is simply adjusted radially away from the center hole 210 of the base 200. In this way, a single test head 100 can be used to test many different sized armatures having many different commutator diameters. This is an advantage over conventional test heads, which are not designed to function with a wide range of armature and commutator sizes.

While the mounting pins 302 are disclosed as dowel shaped pins, any shape or type of mounting structure may be used. For example, square or rectangular pegs, or an elongated protrusion may be used. Any configuration that provides alignment between the contact mounting assemblies 300 and the base 200, while allowing for radial adjustability of the contact mounting assemblies 300 would be sufficient.

In addition to the mounting pins 302, the contact mounting assemblies 300 may have a mount 304. As disclosed, the mounts 304 are blanks of material having threaded holes that engage the mounting screws 306. The mounting screws 306 may be any suitable type of screw, such as flat head machine screws. The heads (not shown) of the mounting screws 306 can be flushly received in a beveled recess in the contact mounting assembly 300 such that movement of the contact probe assembly 400 is not hindered or blocked. The mounting screws 306 can be tightened so that the mount 304 is engaged against the base 200 in order to lock the contact mounting assemblies 300 in a specific radial position.

While a blank and flat head screws are disclosed, any suitable mounting system may be used. For example, the mounting pins 302 can be threaded rods and the mounts could be threaded nuts that can be tightened onto the mounting pins 302. Alternatively, the mounting pins 302 could engage the slots 220 in a snap-fit manner to form the mounts. Essentially, any mounting system that allows the contact mounting assemblies 300 to be readily removed and attached to the base 200 will suffice.

As disclosed in FIG. 5, markings 250 can be placed on the base 200, in any suitable known manner, in order to aid with the radial positioning of the contact mounting assemblies 300. As shown, the markings are simply line markings, but any markings matching up with the mounts 304 would also be appropriate. In fact, any markings that would aid with the radial placement of the contact mounting assemblies 300 would be sufficient, including, for example, color coding.

Once the joined contact probe and contact mounting assemblies 300, 400 are mounted onto the base 200, the test leads 430 and the hoses 340 can be connected to the base 200. For each joined contact probe and contact mounting assembly 300, 400 there is a connector receiver 240 mounted on the base 200. Exemplary connector receivers are available from Molex, Inc., Lisle, Ill., as part no. 39860-0702.

In the case when the base 200 is a printed circuit board, the connector receivers 240 are mounted to the base 200 in a known manner, such that the connectors 440 of the test leads 430 are connected to the connector receivers 240, and the test leads 430 are in electrical communication with the circuitry of the printed circuit board. For alternative substrates forming the base 200 the test leads 430 can be connected to wiring in any known manner.

Each of the hoses 340 can be connected to the base 200 through respective holes 230 in the base 200. As disclosed, the hoses 340 extend through the base 200. In alternative embodiments, two hoses 340 may engage each of the holes 230 in the base 200, such that one set of hoses 340 is provided on one side of the base 200 and another set of hoses 340 is provided on the other side of the base 200. In this case, a sealing washer 350 can be arranged between each hose 340 and each hole 230 in the base 200 such that there is an air and fluid tight seal between each hose 340 and the base 200. If a single hose 340 is provided to extend through the base, the washer 350 may still be provided to protect the hoses 340 from damage due to abrasion from the holes 230 in the base 200.

As shown in FIG. 5, the hoses 340 extend through the holes 230 to the reverse side of the base 200. Each of the hoses 340 can be connected to a manifold 520, which is further connected to a pressure source 500 through another hose 510. Alternatively, each hose may be directly connected to a pressure source 500. The pressure source 500 can be any known pressure source, such as a pneumatic or hydraulic pump, such that the piston heads 360 can be actuated.

In use, the test head 100 functions in the following manner. An armature consisting of a commutator having a defined diameter and a defined number of bars is placed within the clearance hole 210 of the test head 100 such that the each commutator bar is aligned with a single contact probe assembly 400.

Once the commutator bars are aligned with the contact probe assemblies 400, the pressure source 500 can supply pressure to the piston cylinders 310. For example, a pressure of 60-80 psi can be provided by the pressure source. The manifold 520 allows the pressure to be provided to each piston cylinder 300 at the same time so that all of the piston cylinders are simultaneously pressurized. Alternatively, each hose may be directly connected to a pressure source 500 so that the piston cylinders 310 may be energized collectively or individually. In a further embodiment, the manifold 520 may be provided with appropriate control valves, as known in the art, in order to allow simultaneous or sequential actuation of the piston cylinders 310. Such control valves can also allow actuation of a single piston cylinder 310 or actuation of only a fraction of the piston cylinders 310. Once all of the selected piston cylinders 310 are pressurized, the piston heads 360, and hence the contact probe assemblies 400 are forced radially towards the commutator bars.

When the contact mounting assemblies 300 are properly positioned on the base 200, the maximum extent of the travel of the piston heads 360 will be such that the contact probe assemblies 400 advance radially only so far so that the spring loaded contact probes 420 contact the commutator bars with good electrical contact but without being damaged. This contact is also aided by the spring loaded contact probes 420 themselves, which are biased towards the armature and commutator. When the spring loaded contact probes 420 make contact with the commuter bars, the springs are compressed so that the spring loaded contact probes 420 are not subjected to damaging forces.

Once the spring loaded contact probes 420 are in contact with the commutator bars, at least one of many tests can be performed. Some exemplary tests are described in U.S. Pat. No. 5,307,019, granted Apr. 26, 1994, herein incorporated by reference and co-owned by the assignee of this disclosure. Further exemplary tests that can be performed with the test head 100 are described below. The first test, the Direct Current Resistance test, applies a direct current to the plurality of the spring loaded contact probes 420 of any contact probe assembly 400 and measures the resistance between them.

In a second test, the individual welds and coil resistances of the armature can be measured. The resistances of the welds are determined by measuring the voltage drop across two adjacent coils, first by providing a known current and including the weld and second by repeating the measurement and excluding the weld. A comparison of the voltage ratios between the two measurements allows the weld resistance to be determined as the difference in voltage divided by the known current. Once all the weld voltages are determined, the coil resistance measurements can be derived by network analysis.

A third test, the Hipot test, allows for arc detection. A voltage is applied for a pre-determined dwell time and the phase relationship between current and voltage is analyzed. Arc detection is possible by comparing the most extreme slope of the current waveform to the arc limit $\Delta I/\Delta t$ (change in current with respect to change in time).

A fourth test, the Armature Surge test, requires discharging a capacitor into the part being tested. The current through the part will resonate as the capacitor discharges and the frequency, amplitude, and decay rate all provide information about the part's inductance. The relative oscillation of the current at a particular frequency is compared to a standard that is determined by testing a part that is known to be good. The deviation from the standard can be useful in identifying turn-to-turn breakdown.

The number of times the tests need to be repeated varies with the number of bars in the commutator. For Bar-to-Bar surge tests, Bar-to-Bar resistance tests and the one second Hipot test, the number of measurements required is 2N+2 where N is the number of bars. An additional resistance test is required to resolve all of the weld resistances.

For tests such as the 180° surge test and the 180° resistance test, the number of measurements required can vary between N+1 to 3N+2, depending on whether one is adding or substituting.

For all of the above tests, the motor armature and the test head 100 can be left in an engaged position. There is no requirement for either the test head 100 or the armature to be rotated after each measurement.

When the tests are completed, the pressure within the piston cylinders 310 can be released. Because the piston heads 360 are biased away from the center of the base 200, as discussed previously, the contact probe assemblies 400 and the spring loaded contact probes 420 are pulled away from the center of the base 200 when the pressure within the piston cylinders 310 is released.

Once the spring loaded contact probes 420 are no longer in contact with the commutator bars, the armature can be removed from the test head 100. The process can then be repeated with another part.

The benefit of the design of the test head 100 is that the next part can have a different diameter or a different bar count, and the same test head 100 can be used to perform the tests described above.

For example, for a part having a larger diameter, the mounts 304 on the contact mounting assemblies 300 are loosened or removed. The contact mounting assemblies 300 are then simply radially adjusted within the slots 220 in the base 200 to be further away from the clearance hole 210. The mounts 304 are then tightened or reattached to lock the contact mounting assemblies 300 in the proper position. Then, the tests can be carried out with a part having a larger diameter, using the same test head 100.

A part having a smaller diameter may also be tested by performing the procedure just discussed, with the exception of radially adjusting the contact mounting assemblies 300 closer to the clearance hole 210. Of course, the size of the slots 220 can be used to limit the range of diameters that can be tested.

Further, armatures having different bar counts can be tested using the same test head 100. In the exemplary embodiment, there are shown twenty-four slots 220 in the base 200 for twenty-four contact mounting assemblies 300 and twenty-four contact probe assemblies 400. One contact assembly is required for each bar in the armature, so armatures having twenty-four bars can be tested with the exemplary test head 100. This requires the slots 220 in the base 200 of the exemplary test head 100 to be spaced at 15° intervals.

Additionally, contact mounting assemblies 300 can be removed from the exemplary test head 100 to test armatures having bar counts of six and twelve. Alternatively, only six or twelve of the piston cylinders 310 may be actuated in order to test armatures having bar counts of six and twelve respectively. Thus, a single test head can be used to test numerous different sized parts and armatures having different bar counts.

C. Alternate Embodiments

While the exemplary test head 100 is shown with twenty-four slots 220 in the base 200, any number of slots may be provided. In particular, if thirty-two slots are provided at 11.25° intervals, armatures having bar counts of eight, sixteen and thirty-two could be tested using the same test head. Alternatively, sixteen slots can be provided at intervals of 22.5° to allow a single test head the capability to test armatures having bar counts of eight and sixteen.

In a further alternate embodiment, a test head can be provided with twenty slots at intervals of 18°. Such a test head could be used to test armatures having bar counts of five, ten and twenty. Alternatively, a test head can include ten slots at intervals of 36° and can be used to test armatures having bar counts of five and ten.

Of course, an odd number of slots may be provided to test parts having an odd number of armatures or components. Alternatively, an odd number of contact assemblies may be provided to a base having an even number of slots. As a further alternative, an odd number of piston cylinders may be actuated.

Test heads in accordance with the principles disclosed herein can have any configuration and number of slots in order to test armatures and parts having any number of bar counts. For certain embodiments the contact mounting assemblies 300 should be mounted in the appropriate slots for testing armatures having bar counts that are less than the maximum bar count testing capability of the test head.

Alternatively, only selected contact probe assemblies 400 can be removed or only select piston cylinders can be actuated in order to test different bar count commutators. Even though the cylinder rods 380 that are not connected to a spring probe assembly 400 will still extend towards the part, the piston heads 360 of these cylinder rods 380 will not contact the part, but instead will remain spaced from the part, even in the fully extended position. In this manner, parts having different bar counts can quickly be tested using the same test head 100 with little manual effort.

Further alternate embodiments of the test head would allow for axial adjustment of the contact mounting and contact probe assemblies. Multiple arrangements of the contact mounting and contact probe assemblies can be provided. Additionally, the test head bases can be stacked to provide a test head having multiple layers for testing parts of different designs. This stacking can be accomplished in any suitable manner known to those having skill in the art, such as by providing spacers between the bases of the test heads, through which threaded studs may pass.

It should also be appreciated that any suitable materials may be used to construct the different components of the test head 100. For example, the contact mounting and contact probe assemblies 300 and 400 can be made from any non-conductive material capable of withstanding high voltages, such as ERTALYTE® or any other suitable material.

Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The skilled artisan will recognize the interchangeability of various features from different embodiments and method steps. In addition to the variations described herein, other known equivalents for each feature can be mixed and matched by one of ordinary skill in this art to construct a test head in accordance with principles of the present invention.

Although this invention has been disclosed in the context of certain exemplary embodiments and examples, it therefore will be understood by those skilled in the art that the present invention extends beyond the specifically disclosed embodiments to other alternative embodiments and/or uses of the invention and obvious modifications and equivalents thereof. Thus, it is intended that the scope of the present invention herein disclosed should not be limited by the particular disclosed embodiments described above, but should be determined only by a fair reading of the claims below.

We claim:

1. A test head for testing electrical components comprising:
   a base having a planar surface and a center;
   at least one contact mounting assembly removably and adjustably connected to the base for radial adjustment with respect to the base;
   a piston cylinder mounted to the contact mounting assembly; and
   at least one contact probe assembly removably and slidably mounted to the contact mounting assembly, the contact probe assembly arranged to be driven radially towards the center of the base by actuation of the piston cylinder;
   wherein the base includes at least one radial slot, the contact mounting assembly slidably received in the radial slot.

2. The test head according to claim 1, wherein the contact probe assembly comprises:
   a spring probe receptacle configured to engage with a piston head of the piston cylinder; and
   at least one biased spring probe received in an end portion of the spring probe receptacle.

3. The test head according to claim 1, wherein the contact mounting assembly includes a receiving portion for removably and slidably receiving the contact probe assembly mounted thereon.

4. The test head according to claim 3, wherein the receiving portion of the contact mounting assembly is a snap fitting.

5. The test head according to claim 1, wherein the contact mounting assembly includes at least one mounting pin slidable within the radial slot.

6. The test head according to claim 5, wherein the contact mounting assembly further comprises:
   at least one mount for engaging the base such that the mount prevents the radial adjustment of the contact mounting assembly.

7. The test head according to claim 6, wherein the base further comprises:
   markings to indicate proper radial placement of the contact mounting assembly.

8. The test head according to claim 1, wherein varying the number of contact probe assemblies and contact mounting assemblies allows for testing of different electrical components, said different electrical components having different bar counts.

9. A test head for testing electrical components comprising:
a base having a center and at least one radial slot;
at least one contact mounting assembly removably and adjustably connected to the radial slot for radial adjustment of the contact mounting assembly with respect to the base;
a piston cylinder including a piston head mounted to the contact mounting assembly; and
at least one contact probe assembly including a spring probe receptacle configured to engage with the piston head and at least one biased spring probe received in an end portion of the spring probe receptacle, the contact probe assembly removably and slidably mounted to the contact mounting assembly, the contact probe assembly arranged to be driven radially towards the center of the base by actuation of the piston cylinder.

10. The test head according to claim 9, wherein the contact mounting assembly includes at least one mounting pin slidable within the radial slot.

11. The test head according to claim 10, wherein the contact mounting assembly further comprises:
at least one mount for engaging the base such that the mount prevents the radial adjustment of the contact mounting assembly.

12. The test head according to claim 11, wherein the base fluffier comprises:
markings to indicate proper radial placement of the contact mounting assembly.

13. The test head according to claim 9, wherein varying the number of contact probe assemblies and contact mounting assemblies allows for testing of different electrical components, said different electrical components having different bar counts.

14. A test head for testing electrical components comprising:
a planar base having first and second faces and a center and at least one radial slot passing through the first and second face;
at least one contact mounting assembly including at least one mounting pin for removable and slidably adjustable engagement with the radial slot and further having at least one radially spaced clearance hole;
at least one mount having at least one radially spaced threaded hole that corresponds to the clearance hole;
at least one mounting screw passing through the clearance hole to threadingly engage the threaded hole for radial adjustment and mounting of the contact mounting assembly with respect to the first face of the base;
a piston cylinder including a piston head mounted to the contact mounting assembly;
at least one contact probe assembly including a spring probe receptacle configured at one end to releasably engage the piston head and at least one biased spring probe received in an opposing end portion of the spring probe receptacle, the contact probe assembly removably and slidably mounted to the contact mounting assembly, the contact probe assembly arranged to be driven radially towards the center of the base by actuation of the piston cylinder.

15. The test head according to claim 14 wherein the mount includes a surface for frictionally engaging the second face of the base in order to prevent the radial adjustment of the contact mounting assembly.

16. The test head according to claim 14 wherein the mounting pin is a rod shaped dowel having one end frictionally received within a mounting hole in the contact mounting assembly.

17. The test head according to claim 14, wherein the base further comprises:
markings to indicate proper radial placement of the contact mounting assembly.

18. The test head according to claim 17, wherein the markings include ruled lines oriented perpendicular to the radial slot.

19. The test head according to claim 14, wherein varying the number of contact probe assemblies and contact mounting assemblies allows for testing of different electrical components, said different electrical components having different bar counts.

* * * * *

UNITED STATES PATENT AND TRADEMARK OFFICE
CERTIFICATE OF CORRECTION

PATENT NO. : 7,583,100 B2  Page 1 of 1
APPLICATION NO. : 11/606103
DATED : September 1, 2009
INVENTOR(S) : Fillmore L. Vaughan, II It is certified that error appears in the above-identified patent and that said Letters Patent is hereby corrected as shown below:

IN THE CLAIMS,

Column 11, Claim 12, line 30 please replace "fluffier" with --further--.

Signed and Sealed this

Twenty-ninth Day of December, 2009

David J. Kappos
*Director of the United States Patent and Trademark Office*